United States Patent [19]

Huxtable et al.

[11] 4,134,103
[45] Jan. 9, 1979

[54] ERROR-REJECTING DATA TRANSMISSION SYSTEM

[75] Inventors: James T. Huxtable, Peoria; Robert G. Miller, East Peoria; Tommy E. Robinson, Peoria, all of Ill.

[73] Assignee: Caterpillar Tractor Co., Peoria, Ill.

[21] Appl. No.: 823,784

[22] Filed: Aug. 11, 1977

[51] Int. Cl.² ............................................. G06F 11/08
[52] U.S. Cl. ............................................. 340/146.1 AB
[58] Field of Search ............................... 340/146.1 AB

[56] References Cited

U.S. PATENT DOCUMENTS

| Re. 22,394 | 11/1943 | Moore et al. | 340/146.1 AB |
|---|---|---|---|
| 2,706,215 | 4/1955 | Van Duuren | 340/146.1 AB |
| 3,005,871 | 10/1961 | Rudolph | 340/146.1 AB |
| 3,055,978 | 9/1962 | Sharin et al. | 340/146.1 AB |
| 3,381,271 | 4/1968 | Van Duuren | 340/146.1 AB |
| 3,461,238 | 8/1969 | Van Duuren et al. | 340/146.1 AB |
| 3,688,261 | 8/1972 | Henderson | 340/146.1 AB |

Primary Examiner—Charles E. Atkinson
Attorney, Agent, or Firm—Phillips, Moore, Weissenberger, Lempio & Majestic

[57] ABSTRACT

A system for transmitting binary-bit words from a sending station to a receiving station wherein each word has the same number N of binary bits and wherein each different word has the same number M of binary 1's and the same number (N-M) of binary 0's as every other word but in a different arrangement. The number of binary 1's in each word received is counted, and if such count is not exactly equal to M, the word is rejected as inaccurately received.

27 Claims, 7 Drawing Figures

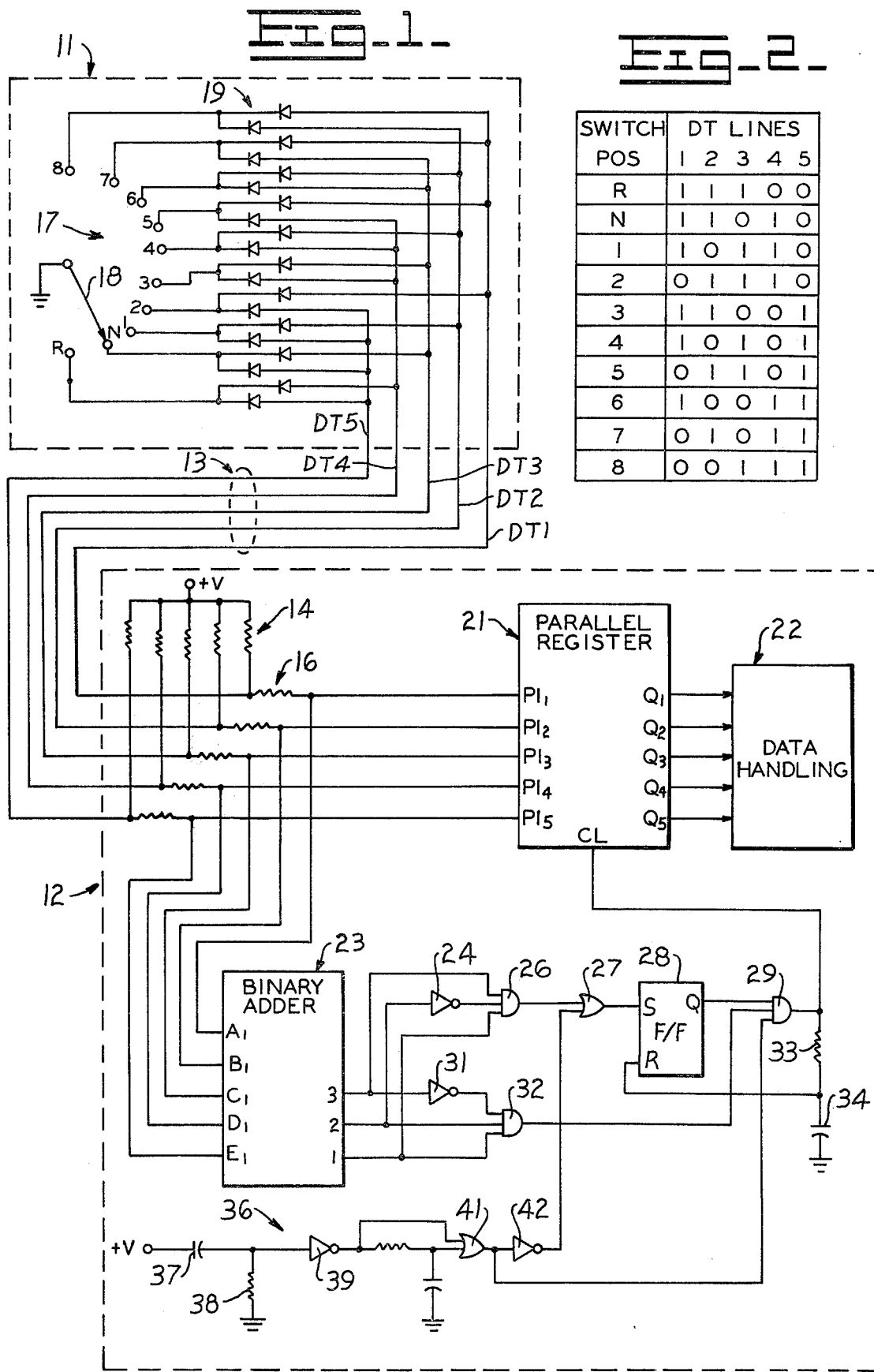

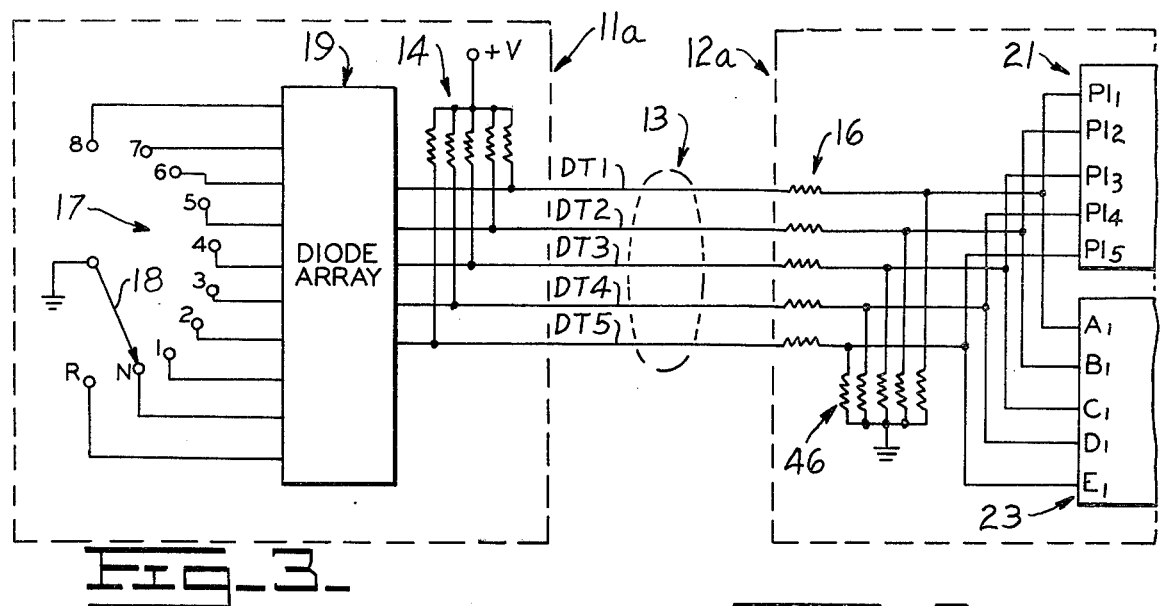
Fig_3_
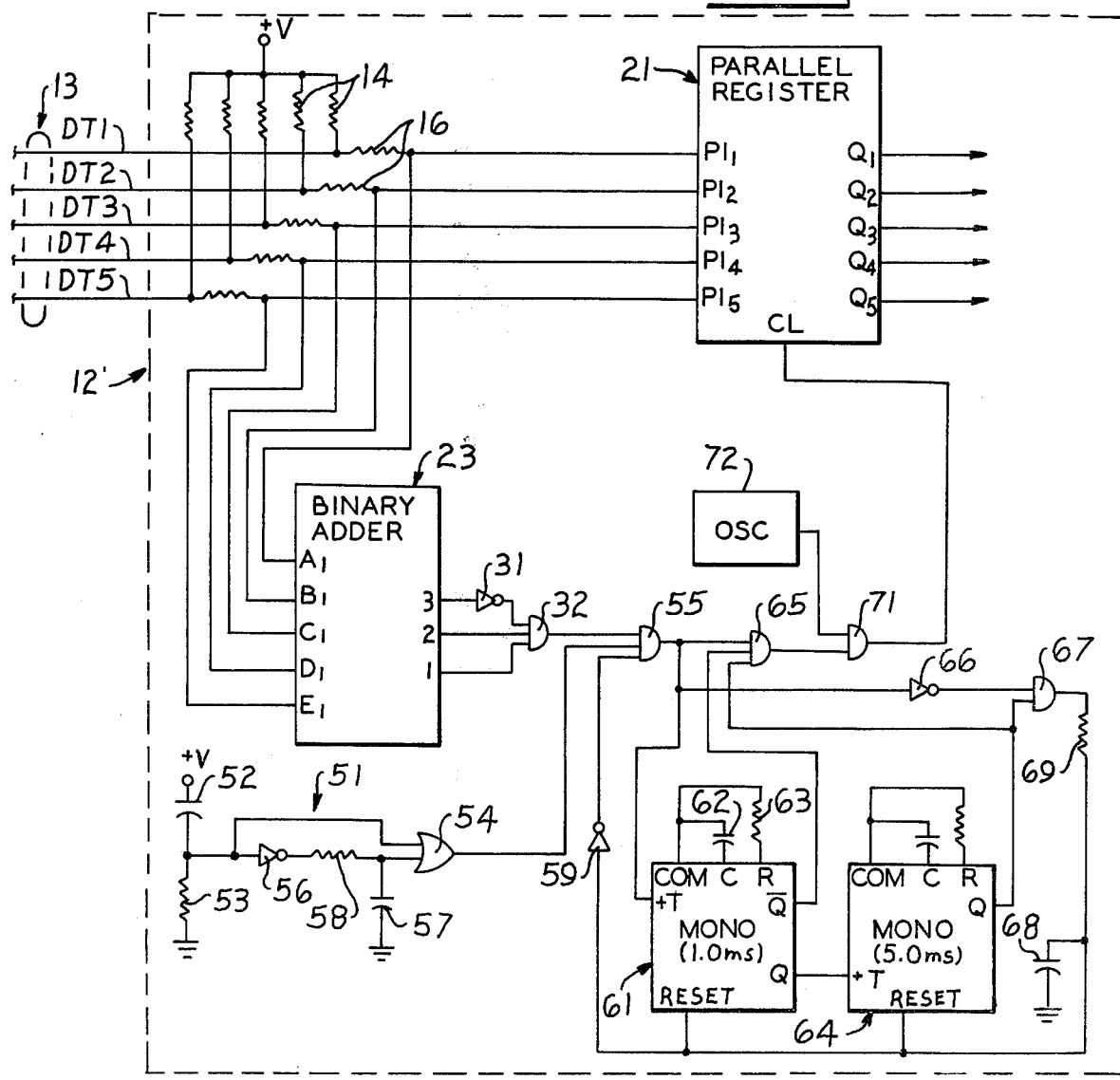
Fig_5_

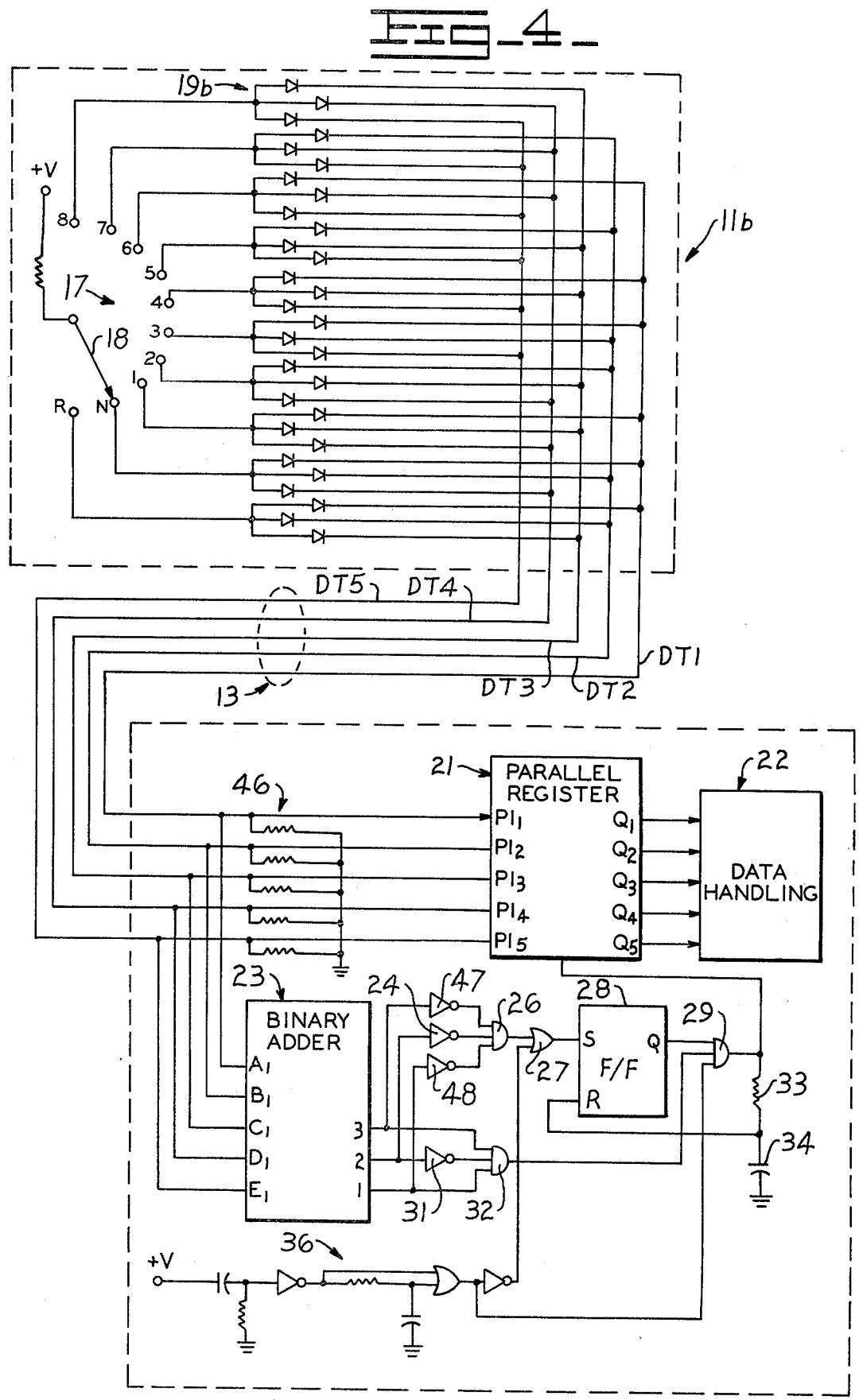
Fig_4

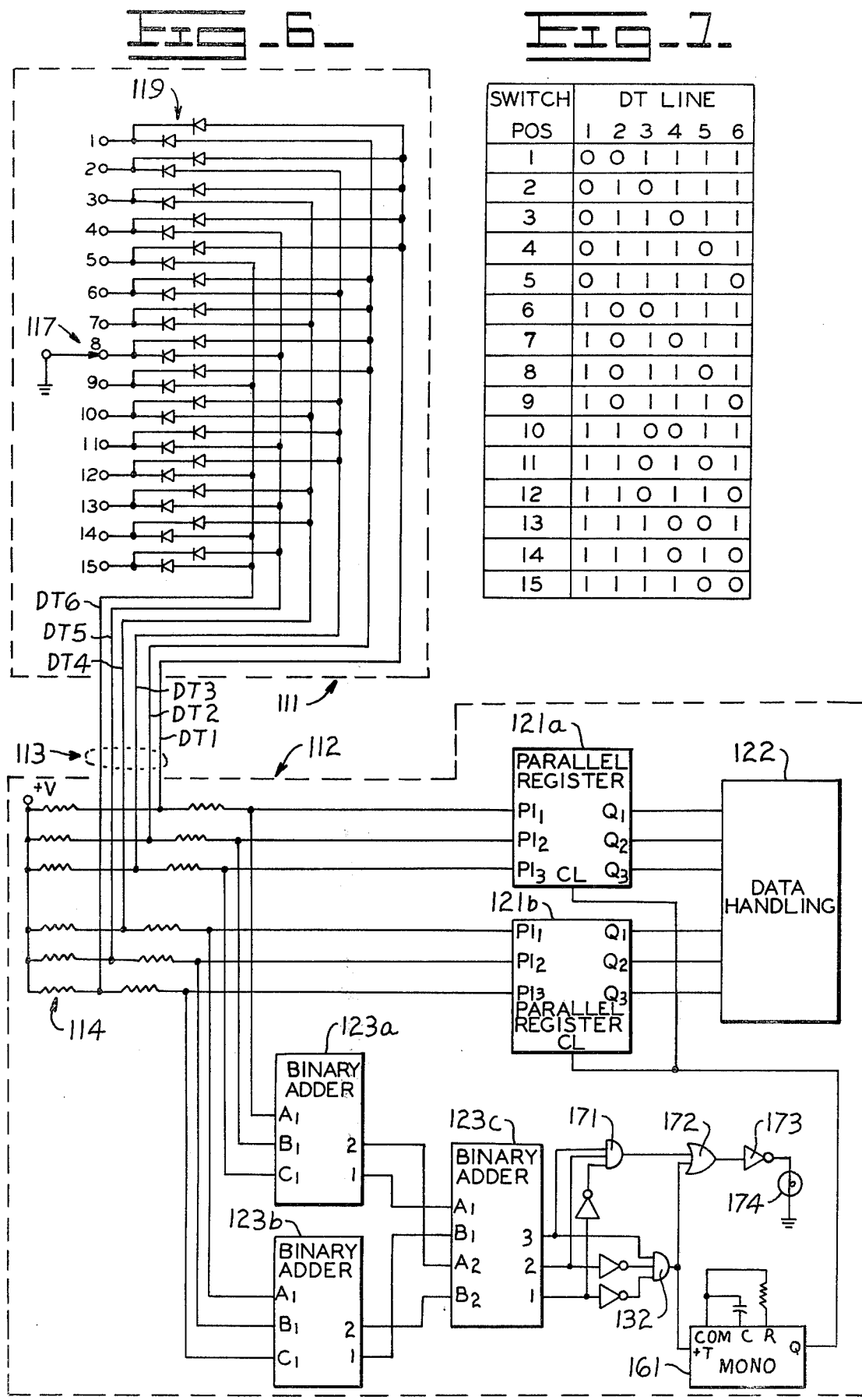

ERROR-REJECTING DATA TRANSMISSION SYSTEM

BACKGROUND OF THE INVENTION

This invention relates to the transmission of binary form data by way of data transmission lines from one station to another and for inhibiting the utilization of such data at the latter station if such data contains errors.

In many instances a word comprised of a plurality of binary 1's and 0's is to be sent broadside from one station to another by way of a transmission cable having a separate line for each bit of the word, the word then being utilized at the latter station to perform or control the performance of, a desired function.

By way of example, many large earth-moving vehicles are provided with separate engines and transmissions at the front and rear of the vehicle and it is desirable that the rear transmission be slaved to the front so that it operates in the same gear. Typically, the transmissions may have eight forward speeds, as well as a reverse and neutral position. In such instances the gear position in which the front transmission is operating is sensed and a signal, coded to that particular gear, is sent to the rear transmission control so that such control will function to put the rear transmission into the same gear position.

For example, the fifth forward gear position may have a binary code of 0101. If the forward transmission is in fifth forward gear a binary coded signal of 0101 is sent to the rear transmission control, and such control will act upon a receipt of a 0101 signal to put the rear transmission into fifth forward gear position. Obviously, successful operation requires that the coded signal received at the rear transmission control be the same as that sent from the front transmission. If a forward gear position signal was sent but was received as a reverse gear position signal serious consequences would result.

In order for the signals to be sent and received without error, the transmission lines must be free of fault. However, such lines are often subject to physical abuse — vibration, chafing, pinching, mashing and so forth which does cause faults to occur. One or more lines may short to the vehicle frame. One or more lines may open. Two or more lines may short to each other. Combinations of these faults may occur.

To prevent malfunctioning of the rear transmission control it is thus necessary that a received signal contain enough information so that it is apparent from the received signal whether it is free from error. Parity systems have been devised for such purpose. For example, a simple odd parity system operates such that the received signal must have an odd number of 1's to be considered as correct. If a word is sent having an even number of 1's, a 1 is sent on the parity line so that the received word will have an odd number of 1's. If ten different words are to be sent, four binary lines and one parity line would be required. However, such a system will not safeguard against multiple transmission faults. A signal sent as 0100 may be received as 0111 if lines were shorted together, with the 0111 received signal being considered permissible since it has an odd number of 1's.

More complex parity systems have been devised to protect against multiple errors, but such systems require additional parity lines in the transmission cable. The cabling cost increases and the additional lines increase the likelihood of fault in the transmission lines.

It is the principal object of the present invention to provide a system for transmitting binary information which will safeguard against the existence of single or multiple faults while using as few transmission lines as possible.

SUMMARY OF THE INVENTION

In general, the various words to be sent are coded in binary form such that each has the same number of binary 1's and 0's as any other word but each coded word is unique. For any given number of transmission lines (one needed for each bit), the maximum number of words which may be handled depends upon the number of binary 1's and 0's to be used, in accordance with the following equation:

$$[N!/M!(N-M)!] = W_{max}$$

wherein,

N = the number of transmission lines,

M = the number of binary 1's to be used in each word, (N−M) = the number of binary 0's to be used in each word, $W_{max}$ = the maximum number of words which may be handled.

For example, if five transmission lines are used, and three binary 1's and two binary 0's are used in each word, the following is true:

$$(5!/3!2!) = (120/6 \times 2) = 10 = W_{max}.$$

A 3-1's, five-line system is thus usable for the transmission control referred to above wherein ten different words are to be sent.

The word is then examined at the receiving station to see if it has the proper number of binary 1's. If it does, the word may then be used. If it does not, the word is rejected as erroneous.

Such system will detect and safeguard against errors arising from any of the following fault conditions in the transmission lines:

(a) one or more of the lines are shorted to ground, (b) one or more of the lines are open, (c) two or more of the lines are shorted to each other, (d) one or more lines are shorted to ground and the lines of another set are shorted to each other.

In addition, with the same number of lines in a system, binary 1's may be impressed on all of the lines when the word that is sent is changed to a new word. In the normal course of operation, a 5-1's signal and then a 3-1's signal will be received at the receiving station. If these two signals are not received, the new selected word is rejected. The use of the 5-1's signal in conjunction with the 3-1's signal provides a safeguard against a fault combination wherein one line is open and another is shorted to ground.

BRIEF DESCRIPTION OF THE DRAWINGS

In the drawings, forming a part of this application, and in which like parts are designated by like reference numerals throughout the same, FIG. 1 is a circuit diagram of a data transmission system incorporating the present invention therein;

FIG. 2 is a table showing the binary coding arrangement for the various words transmitted in the system of FIG. 1;

FIG. 3 is a modification of the system of FIG. 1;

FIG. 4 is a further modification of the system of FIG. 1;

FIG. 5 is a circuit diagram of another embodiment of a data transmission system incorporating the present invention therein;

FIG. 6 is a modification of the system of FIG. 1, utilizing a greater number of data transmission lines;

FIG. 7 is a table showing the binary coding arrangement of the various words transmitted in the system of FIG. 6.

DESCRIPTION OF THE PREFERRED EMBODIMENTS

Referring now to FIG. 1, such figure discloses a 3-1's system having a sending station 11, a receiving station 12 and an interconnecting data transmission cable 13 having five data transmission lines DT1 through DT5. As mentioned previously, such a system will enable up to ten different binary coded words to be sent from the sending to the receiving station. The sending and receiving stations have a common ground, as for example the frame of a vehicle with which both are used.

The receiving station 12 includes a plurality of resistors 14 which connect the data transmission lines DT1 through DT2 individually to a source of positive voltage so that a voltage is normally impressed on each of these lines corresponding to a binary 1. Resistors 16 are provided in the data transmission lines for current limiting purposes.

The sending station 11 comprises a word selection means, herein shown as a rotary switch 17 having a grounded switch blade 18 adapted to engage and thereby ground any of the switch terminals. Switch 17 may be connected to the gear shifting mechanism (not shown) of an engine transmission for movement thereby so that the switch blade contacts the terminal corresponding to the gear position of the transmission. As illustrated, switch 17 has ten terminals, R, N and 1-8, corresponding to reverse, neutral and eight forward gear positions. The sending station also includes a coding means, shown herein as a diode array 19, wherein each of the ten switch terminals is connected through diodes to two of the data transmission lines, each terminal being connected to a different set of two lines. As shown in FIG. 1, if the switch blade is in contact with the N terminal, data transmission lines DT3 and DT5 will be grounded so that a binary 0 is impressed on these two lines. The remaining data lines DT1, DT2 and DT4 will be ungrounded and will thus have a binary 1 impressed on them through their resistors 14.

FIG. 2 tabulates the binary coding impressed on the five data transmission lines for each of the ten switch positions. As will be seen, each selected word has 3-1's and 2-0's with a unique distribution of 1's and 0's for each word. Switch 17 is constructed in break-before-make form so that when switch blade 18 is moved from one terminal to another it is out of engagement with all of the terminals before it moves into engagement with the next. As a consequence, when the word selected to be sent is changed, all five of the data transmission lines will be ungrounded and a binary 1 will be impressed on all of the lines as the switch blade 18 moves from one terminal to another.

At the receiving station, the data transmission lines are connected to a transmission gate means 21 having a plurality of inputs $PI_1$ through $PI_5$ each of which is connected to one of the data lines DT1 through DT5. When energized, the transmission gate means 21 will impress on the outputs $Q_1$ through $Q_5$ the binary 1's and 0's present on the inputs thereof. As shown herein, the data transmission gate means 21 is a conventional parallel register having latchable outputs which when energized by a clock pulse will latch the outputs in a binary state in accordance with that at the input thereof. Thus, when the parallel register 21 is clocked, the binary code on the data transmission lines will be clocked through and latched at the Q outputs thereof. These outputs are connected to the data-handling means 22 wherein the data is utilized for whatever purpose is desired. For example, in a transmission control the binary coded word at the Q outputs of gate means 21 would be used to put the transmission into gear position indicated by the code of the received word.

The data transmission lines are also connected to the inputs $A_1$ through $E_1$ of the binary adder 23. Such adders function to count the number of binary 1's at its input and to give a binary representation of the sum of 1's at its outputs 1, 2 and 3. For example, if there are two 1's at the inputs, output 2 will be high and outputs 1 and 3 will be low. If there are three 1's, outputs 1 and 2 will be high and output 3 will be low. If there are 5-1's, outputs 1 and 3 will be high and output 2 will be low, and so forth.

If 5-1's are present on the data transmission lines, as will be the case during the time that switch blade 18 is moving from one terminal to another, the two high outputs 1 and 3 of binary adder 23, and the low 2 output thereof, inverted by inverter 24 will cause the output of AND gate 26 to go high. This in turn causes the output of OR gate 27 to go high so that flip-flop 28 is set, causing its Q output to apply a high to AND gate 29.

When switch blade 18 moves into engagement with one of the terminals, two of the data transmission lines are grounded, leaving the other three with binary 1's impressed thereon. The binary adder 23 now counts three 1's and its 1 and 2 outputs go high while its 3 output goes low. Inverter 31 inverts this low so that all inputs to AND gate 32 are high, causing it to output a high to gate 29. If the remaining input to gate 29 is also high, the output of gate 29 will go high to apply a clock pulse to the parallel register 21. Resistor 33 and capacitor 34 connecting the output of gate 29 to ground provide a delayed reset voltage at their junction which is used to reset flip-flop 28 and thereby terminate the clock pulse. The length of the clock pulse is thus determined by the RC values of resistor 33 and capacitor 34.

The power-up circuit 36 is provided to enable the clock pulse to parallel register 21 to be applied when power is first applied. At such time, the voltage at the junction of capacitor 37 and resistor 38 is substantially at the applied voltage V and the output of inverter 39 is low. Both inputs to OR gate 41 are low and its output is low. Such low output is applied to gate 29 to inhibit its operation. The initial low output of gate 41 is also inverted by inverter 42 so that a high is applied to OR gate 27 to cause the 5-1's flip-flop 28 to be set. As capacitor 37 charges, the input to inverter 39 will drop, and when the transfer point is reached the output of inverter 39 will go high, causing the output of gate 41 to go high. If the output from the 3-1's gate 32 is high, gate 29 will now output a high to clock the parallel register 21. As long as power continues to be applied, gate 41 will output a high to gate 29 and an inverted low to gate 27.

In operation, when power is first applied, gate 29 will generate a clock pulse and apply it to parallel register 21 as soon as the warm-up delay is ended, providing that there is at that time 3-1's on the data transmission line so that the output of the 3-1's gate 32 is high. (If the switch blade 18 were between terminals, the clock pulse would be delayed until there were 3-1's on the transmission lines.) The Q outputs of the shift register 21 would then be latched in accordance with the binary state of the lines and would apply that information to the data-handling means 22.

In due course, it will be desired to actuate switch 17 to select and send a new binary coded word to the receiving station. Movement of switch blade 18 from a terminal causes 5 binary 1's to be impressed on all of the lines at the receiving station so that the binary adder will cause the 5-1's gate 26 to set flip-flop 28. Such setting provides an indication at the receiving station that the transmitted word is being changed. As soon as the change is complete and switch blade 18 again engages a terminal, 3-1's will be impressed on the lines. The signal from the 3-1's AND gate 32 will now cause gate 29 to generate a clock pulse. The 3-1's gate 32 will, of course, be high if, and only if, the binary adder 23 counts 3-1's. Thus, the parallel register will not be clocked to pass through the new coded word unless such new word has 3-1's and only 3-1's in it. Since shift register 21 is only clocked when 3-1's appear on the data transmission lines, the previously transmitted word will appear at its outputs until the new word is clocked through. As a consequence, the output of the shift register always has a 3-1's word — it does not pass through the 5-1's signal which occurs between transmitted words.

If the cable 13 is damaged such that any one line is shorted to ground, that line will thereafter cause a binary 0 to appear therein at the receiving station. A 3-1's coded signal can still be sent and received and clocked through the shift register providing that that particular line is intended to be grounded by switch 17 and the diode array 19. In such case, the fault will not prevent accurate transmission of that particular data. However, if that line was to be ungrounded by switch 17, that would mean that two others would be grounded. As a consequence, three of the lines at the receiving station would be grounded, with binary 0's and only two of the lines would have binary 1's. With only two 1's, the 3-1's gate 32 will remain low to inhibit clocking of the shift register so that the erroneous word cannot be clocked therethrough. The same will happen if more than one line is shorted to ground.

If the cable is damaged so that one line is broken, then that line cannot be grounded at the sending station and it will remain with a binary 1 impressed on it at the receiving station. Again, if the word being sent is such that that line is supposed to be 1, data can be sent. However, if the word is such that that particular line is to be grounded at the sending station, only one other line will be grounded, and there will be 4-1's at the receiving station. The 3-1's gate 32 will again inhibit clocking through of such word. A plurality of broken lines will likewise prevent an erroneous word from being clocked through to the data-handling means.

A third type of cable fault can exist if two or more wires short together. If a pair does short together, then if switch 17 grounds either one, both will be grounded at the receiving station. A 3-1's signal can be sent, and received if, and only if, both lines are supposed to be 0 or if both are to be 1's. In such case the received signal would be in conformity with the sent signal. If one of the shorted-together lines is supposed to be a 0 and the other a 1, a 3-1's signal cannot be received. The same is true for any combination of lines shorted together — it may be possible to receive a word with 3-1's, but if so, such received word will be the same as sent. It is not possible to receive a 3-1's word which differs from the sent word.

It is also not possible to receive a word with 3-1's which disagrees with the sent word if there is a combination of cable faults such that one or more lines are shorted to ground, and another set of lines are shorted together.

It is possible to have a cable fault such that one or more lines are shorted to ground while one or more are open. For example, suppose one line is open (such that it will always have a binary 1 at the receiving station) and one line is shorted to ground (such that it will always have a binary 0 at the receiving station). In such case, the word sent could be such that a 1 is supposed to be on the shorted line and a 0 is supposed to be on the open line. A 3-1's word would be present at the receiving station, but it would be different from that sent. However, the fact that a 0 is always on the shorted-to-ground line makes it impossible to set the 5-1's flip-flop 28 so that gate 29 is inhibited from generating a clock pulse when the erroneous 3-1's signal from gate 32 appears.

FIG. 3 shows a modification of the invention. Although it is preferable to supply the pull-up voltage at the receiving station on the data transmission lines, to normally impress binary 1's on the lines thereat, it is possible to do so at the sending station. Thus, in FIG. 3, the sending station 11a includes the pull-up resistors 14 which individually connect the data transmission lines DT1 through DT5 to a positive voltage so that binary 1's are impressed on the lines if they are not grounded. As before, the lines are connected by a diode array 19 so that switch 17 will ground a selected set of two lines according to the position of the switch.

The receiving station 12a is the same as previously described except that the pull-up resistors 14 are not used therein. Tie-down resistors 46 are added, to individually connect each data transmission line to ground, so that if any of the data transmission lines in cable 13 should open, the inputs of the shift register 21 and binary adder 23 connected thereto will be grounded. The tie-down resistors 46 are sized relative to the pull-up resistors 14 and current limit resistors such that the voltage on the lines will normally represent a binary 1 if no cable fault is present and the lines are not grounded by switch 17.

The operation of the system of FIG. 3 is the same as that of FIG. 1, and the same safeguards against transfer of erroneous information through the shift register 21 are provided. In addition, since an open data transmission line in cable 13 results in a binary 0 on such line at the receiving station the 5-1's signal sent by the sending station when a word is being changed cannot be received at the receiving station if a cable fault is present which includes an open line — either by itself or in combination with any other fault, and the 5-1's gate 26 will never set flip-flop 28.

Further, since both an open line and a line shorted to ground have the same result, i.e., a binary 1 cannot be received on such line, it is not possible to receive an erroneous 3-1's word if there is a combination of open lines and lines shorted to ground. This is so because in order to receive a 3-1's word which differs from the word which is sent, for each binary 1 sent and received as a binary 0 there must also be a binary 0 sent which is received as a binary 1.

FIG. 4 sets forth another modification of the invention. In this case, instead of grounding selected data transmission lines by use of switch 17, the movable switch member 18 at the sending station 11b is connected to a positive source of voltage to impress such voltage on the switch terminal. Diode array 19b connects each switch terminal to a different set of three of the data transmission lines DT1 through DT5 so that 3-1's will be present on the lines in accordance with the code set forth in FIG. 2. The other lines will be grounded at the receiving station by means of tie-down resistors 46. Since no 1's will be impressed on the data transmission lines when switch blade 18 is moved from one terminal to another, the receiving station is further modified by applying the 1 and 3 outputs of the binary adder 23 through inverters 47 and 48 to gate 26 as well as inverting the 2 output and applying it thereto so that the 5-1's gate 26 will output a high when no 1's are present on the lines.

This system operates as previously described and will safeguard against reception of the same erroneous 3-1's signal as discussed in connection with FIGS. 1 and 3.

FIG. 4 differs, however, from FIGS. 1 and 3 in that open or shorted lines do not affect the operation of the 5-1's gate 26 when switch 17 is switching from one terminal to another, since when switch 18 is not impressing a positive voltage on any terminal, all of the lines DT1 through DT5 will be grounded at the receiving station by tie-down resistors 46 even though such lines may be open or grounded in the connecting cable. Thus, the 5-1's gate 26 functions merely to indicate that the switch 17 is being changed from one position to another so that gate 29 is conditioned to produce a pulse to clock the register 21 when a 3-1's signal is next received at the receiving station.

If desired, FIG. 4 could be further modified so that all lines DT1 through DT5 have a positive voltage impressed on them when switch blade 18 is in the process of moving from one terminal to another and is thus out of contact with any terminal. For example, a second switch, identical to switch 17 could be used, its movable member being gauged to move with that of switch 17 so that it would contact a terminal when switch 17 does not, and vice-versa. The second switch could then be connected by suitable isolation diodes to impress a positive voltage on all of the lines DT1 through DT5. If a 5-1's signal is thus impressed on the lines, any open or any shorted line would prevent the 1 thereon from appearing at its input to binary adder 23. With such modification, the adder 23 could be connected to the 5-1's gate 26 as shown in FIG. 1 so that gate 26 would go high if all lines inputted to the adder have 1's imposed thereon.

FIG. 5 discloses a modified receiving station 12' usable with the sending station of FIG. 1, the receiving station 12' differing from that previously described primarily the manner that the parallel register 21 is clocked in response to the presence of a 3-1's signal from the 3-1's NAND gate 32. A power-up circuit 51 provides an initial high signal from the junction of capacitor 52 and resistor 53 when the power is first turned on, which causes OR gate 54 to output an initial high signal to AND gate 55. The initial high to AND gate 55 ends when capacitor 52 charges to a voltage sufficient to lower the direct input to gate 54 below its transfer level. The subsequent low across resistor 53 is inverted by inverter 56 causing capacitor 57 to charge through resistor 58. In due course the charge on capacitor 57 causes OR gate 54 to again output a high to AND gate 55, which high will remain until the power is turned off.

Assuming that a word with 3-1's is being received by the receiving station 12', the coincidence of the 3-1's signal from gate 32, the initial power-up pulse and the normally high output of reset inverter 59 will cause the output of AND gate 55 to go high. This high is applied to the +T trigger input of monostable 61 causing it to generate a pulse of a length determined by the values of its external capacitor 62 and resistor 63. For a mechanical switch 18 as illustrated in FIG. 1, the duration of the pulse from monostable 61 is preferably in the order of 1 millisecond. As monostable 61 pulses its high Q output provides a positive edge trigger to the +T input of monostable 64 causing it to generate a pulse, in the order of 5 milliseconds. The low Q output of monostable 61 is applied to AND gate 65 to inhibit its operation during the pulse from monostable 61. At the end of the 1 millisecond pulse the Q output of monostable 61 goes high, so that the presently high Q output from monostable 64 will cause the output to gate 65 to go high for the remaining 4 milliseconds of the monostable 64 pulse.

The two monostables 61 and 64 thus act together to cause AND gate 65 to generate a four-millisecond clock pulse which begins one millisecond after monostable 61 is triggered. This one-millisecond delay in the generation of the clock pulse prevents spurious signals, resulting from contact bounce when switch 17 is switched to a new position, from adversely affecting operation.

To further ensure against malfunctions from contact bounce the output of gate 55 is inverted by inverter 66 and applied to AND gate 67 along with the Q output of monostable 64. Such Q output goes high essentially at the same time that gate 55 first goes high in response to a 3-1's signal from gate 32 and trigger on monostable 61. If there is contact bounce when switching occurs, the 3-1's signal from adder 23 will disappear, so that the outputs of gates 32 and 55 will go low and the output of reset gate 67 will go high. If the signal is lost for a time sufficient for filter capacitor 68 to charge through resistor 69, a reset signal will be applied to monostables 61 and 64 to terminate their pulses. The high reset signal is also inverted by inverter 59 to apply a low to gate 55, causing its output to go low, enabling a clean positive-edge trigger to be applied to monostable 61 when gate 55 subsequently goes high. Monostables 61 and 64 will then generate new pulses and again provide a one-millisecond delay between the time that monostable 61 is triggered and the time that gate 65 can go high. Thus, if there is contact bounce and loss of the 3-1's signal the delay period is extended and the clock pulse from gate 65 will not be generated until after the 3-1's signal from gate 32 has stabilized.

The clock pulse from gate 65 may be applied directly to the parallel register 21. However, as shown herein it is applied to AND gate 71 along with the output of oscillator 72. Gate 71 will then produce a chain of pulses at the frequency of oscillator 72 during the four-millisecond high period of gate 65 which are applied to parallel register 21 to ensure clocking thereof.

When switch 17 is subsequently actuated to select a new word to be sent, binary 1's will be impressed on all of the data transmission lines. The output of the 3-1's gate 32 goes low, signifying that the count in binary adder 23 is other than 3. The output of gate 55 also goes low to condition monostable 61 to be triggered. A subsequent count of 3 by the binary adder 23 will cause gates 32 and 55 to go high so that a positive edge pulse is applied to monostable 61. The subsequent clock pulse then clocks the new 3-1's word through parallel register 21 and latches such word at the Q outputs thereof.

The system of FIG. 5 will safeguard against erroneous signals being clocked through shift register 21 in the same manner as described in connection with FIG. 1, except that a 5-1's signal is not used here. If desired, a 5-1's gate 26 and flip-flop 28 could be added to FIG. 5 to inhibit the operation of gate 65 if a 5-1's signal is not present during change of the selected word, if desired.

Likewise, the manner in which the data transmission lines of FIG. 5 are coded may be as shown in FIGS. 3 or 4, if desired.

In the various embodiments discussed above switch 17 has been described as a mechanical switching device. It is of course possible to utilize any conventional electronic device to perform the same function, namely, to cause binary 1's or 0's to be impressed on the proper lines.

In the various embodiments discussed above, five data transmission lines are needed to enable a five-bit, 3-1's code to be used, for up to ten different words. Also, these embodiments show the five-bit words being clocked through parallel register 21 for application as five-bit words to the data handling means 22 for further use or processing. However, if it is so desired, only four of the five bits need be applied to the data handling means, since a four bit signal may be used for the ten different words transmitted. For example, only the Q1-Q4 outputs of register 21 might be used, to apply the data on lines DT1-DT4 to the data handling means. As will be noted from the table of FIG. 2, the coding on lines DT1-DT4 is uniquely different for each of the ten different switch positions. Similarly, data lines DT2-DT5 could be selected for final application to the data handling means. Again, the binary coding of these four lines is uniquely different for each of the ten words so that no two of the four bit words finally used would be the same.

It follows also that if only four of the five data lines are used for actual application to the data handling means, the parallel register 21 need have only four inputs and outputs converted to the selected data lines. All five of the data lines would still be applied to the binary adder 23 so that the presence of a 3-1's condition can be determined for clocking of the register.

Although the embodiments described above use five data transmission lines and a 3-1's code, it is to be realized that the present system for data transmission is not limited thereto.

As, for example, a system such as shown in FIG. 6 may be used, such system having a sending station 111, a receiving station 112 and an interconnecting cable 113 having six data transmission lines DT1 through DT6, the system being arranged to operate on a 4-1's code. As shown by the equation $[N!/M!(N-M)!] = W_{max}$, up to fifteen different words may be handled by such system. The coding of the different words may be as set forth in the table of FIG. 7.

As before, switch 117 is actuated to ground a selected group of data transmission lines through diode array 119 for each switch position, the other lines being held high by pull-up resistors 114 at the receiving station. The data transmission lines are connected to the inputs of the transmission gate means, shown here as two parallel registers 121a and 121b, these registers being parallel to provide sufficient capacity. The Q outputs again go to the data-handling means 122.

The counting means is shown herein as binary adders 123a, 123b and 123c, again to handle the number of data lines inputted thereinto. As before, if there are four 1's anywhere on the six data lines, the 3 output of adder 123c will be high and the 1 and 2 outputs will be low. If the count is four, and only four, AND gate 132 will go high to trigger monostable 161 so that a clock pulse of predetermined length is generated and applied to shift registers 121a and 121b to clock the binary state of the inputs therethrough.

If desired, a 6-1's AND gate 171 may be connected to the inverted 1, and to the 2 and 3 outputs of binary adder 123c, gate 171 outputting a high when the switch 117 is moving from one terminal to another. If the system is functioning properly, a high will be outputted at all times, either by the 4-1's gate 132 or the 6-1's gate 171. As a consequence the output of OR gate 172 will be high at all times and the output of inverter 173 will be low. If there is a loss of the 4-1's signal from gate 132 at any time (other than when switching from one switch position to another), the output of inverter 173 will go high to energize the warning light 174, which thus signals that a fault exists.

If desired, the system of FIG. 6 could be operated with a 2-1's code, if a diode array were to be used to ground four of the lines for each switch position. The code would then be the reverse of that shown in FIG. 7. In such case, gate 132 would be connected to the outputs of adder 123c so that gate 132 would go high if the count was two. Again, up to fifteen words could be handled by such system.

Also, if desired, the system of FIG. 6 could be used as shown, with a grounded switch at the sending station and with a 4-1's code impressed on the data transmission lines, such system being used to produce words with a 2-1's code at the data-handling means 122. In such case inverters would be used at the inputs or outputs of the parallel registers 121a and 121b, or else the Q outputs of the parallel registers could be used for such inversion.

Additionally, if desired, the six-transmission-line system of FIG. 6 could be used to transmit words each having a 3-1's code. In such case the diode array would be designed to ground three different lines for each switch position. Such a system would enable up to twenty different words to be handled.

Similarly, a seventh data transmission line could be added to increase the number of words that can be handled. A seven-line, 4-1's code would enable up to thirty-five different words to be used, each word having a unique arrangement of four binary 1's and three binary 0's.

In any event, regardless of the number of transmission lines and the selection of the code to be used therewith, each different word must contain the same number of binary 1's and binary 0's as all of the other words. The selected number of binary 1's (or binary 0's) must be present at the receiving station to verify that the word sent has been properly received.

The embodiments of the invention in which an exclusive property or privilege is claimed are defined as follows:

1. Apparatus for transmitting words composed of binary bits, comprising:
   a sending station,
   a receiving station,
   transmission means comprising a cable connecting said sending and receiving stations and having N number of transmission lines,
   word-selection means at said sending station for selecting one of up to [N!/M!(N−M)!] different words to send, wherein M is an integer and N>M>O,
   coding means associated with said transmission lines and said word-selection means and having means at said receiving station for normally impressing a voltage corresponding to a binary 1 on each of said transmission lines and having means for individually grounding a selected (N−M) number of said transmission lines at said sending station in accordance with the word selected by said word-selection means, the distribution of 1's and 0's on said transmission lines being uniquely different for each different word selected by said word-selection means,
   counter means for counting the number of binary 1's on said transmission lines at said receiving station,
   means at said receiving station and responsive to the count of said counter means for enabling binary data impressed on said transmission lines to be used at said receiving station if the count of 1's is equal to M and for inhibiting such use if said count is not equal to M.

2. Apparatus as set forth in claim 1 wherein said means responsive to the count of said counter means for enabling or inhibiting use of binary data impressed on said transmission lines includes:
   a transmission gate means having a plurality of inputs each of which is connected to a selected one of said transmission lines and an output associated with each of said inputs, said transmission gate means being operable when energized to connect said inputs to said outputs, and
   means for energizing said transmission gate means if, and only if, the count of binary 1's by said counter means is equal to the number M.

3. Apparatus as set forth in claim 2,
   wherein said transmission gate means has latchable outputs and said transmission gate means is energizable by a clock pulse to latch said outputs in a binary state in conformity with the binary state of said inputs during said clock pulse,
   and wherein said means for energizing said transmission gate includes means for generating a clock pulse in response to a count of binary 1's by said counter means if, and only if, the couunt is equal to the number M, and means for applying said clock pulse to said transmission gate means.

4. Apparatus as set forth in claim 2,
   wherein said coding means includes means for ungrounding all of said transmission lines at said sending station if the selection of a word by said word-selection means is changed,
   wherein said transmission gate means has latchable outputs and said transmission gate means is energizable by a clock pulse to latch said outputs in a binary state in conformity with the binary state of said inputs during said clock pulse,
   and wherein said means for energizing said transmission gate means includes means for generating a clock pulse of predetermined duration and for applying said clock pulse to said transmission gate means if, and only if, the count of binary 1's by said counter means is first other than M and is subsequently equal to M.

5. Apparatus as set forth in claim 2,
   wherein said coding means includes means for ungrounding all of said transmission lines at said sending station if the selection of a word by said word-selection means is changed,
   wherein said transmission gate means has latchable outputs and said transmission gate means is energizable by a clock pulse to latch said outputs in a binary state in conformity with the binary state of said inputs during said clock pulse,
   and wherein said means for energizing said transmission gate means includes means for generating a clock pulse of predetermined duration and for applying said clock pulse to said transmission gate means if, and only if, the count of binary 1's by said counter means is first equal to N and is subsequently equal to M.

6. Apparatus as set forth in claim 2,
   wherein said coding means includes means for ungrounding all of said transmission lines at said sending station if the selection of a word by said word-selection means is changed,
   wherein said transmission gate means has latchable outputs and said transmission gate means is energizable by a clock pulse to latch said outputs in a binary state in conformity with the binary state of said inputs during said clock pulse,
   and wherein said means for energizing said transmission gate means includes flip-flop means settable in response to a count of binary 1's by said counter means equal to N and means responsive to a setting of said flip-flop means and also to a count of binary 1's by said counter means equal to M for generating said clock pulse and for applying said clock pulse to said transmission gate means.

7. Apparatus as set forth in claim 6 and further including:
   means responsive to the generation of said clock pulse for resetting said flip-flop means.

8. Apparatus for transmitting words composed of binary bits, comprising:
   a sending station,
   a receiving station,
   transmission means connecting said sending and receiving stations and comprising N number of transmission lines,
   word-selection means at said sending station for selecting one of up to [N!/M!(N−M)!] different words to send, wherein M is an integer and N>M>O, said word-selection means comprising a multi-position switch having up to [N!/M!(N−M)!] terminals and a grounded switch member movable into individual engagement with any one of said terminals, said switch member being out of engagement with all of said terminals during movement from one terminal to another,
   coding means for normally impressing a voltage individually on all of said transmission lines and including a diode array connecting a different set of (N−M) number of transmission lines to each of said switch terminals, counter means for counting the number of binary 1's on said transmission lines at said receiving station, means at said receiving station and responsive to the count of said counter means for enabling binary data impressed on said transmission lines to be used at said receiving station if the count of 1's is equal to M and for inhibiting such use if said count is not equal to M.

9. Apparatus as set forth in claim 8 wherein said means normally impressing voltage on each of said transmission lines is situated at said receiving station.

10. Apparatus as set forth in claim 8, wherein said means responsive to the count of said counter means for enabling or inhibiting use of binary data impressed on said transmission lines includes:

a transmission gate means having a plurality of inputs each of which is connected to a selected one of said transmission lines and an output associated with each of said inputs, said transmission gate means being operable when energized to connect said inputs to said outputs, and means for energizing said transmission gate means if, and only if, the count of binary 1's by said counter means is equal to the number M.

11. Apparatus as set forth in claim 10, wherein said transmission gate means has latchable outputs and said transmission gate means is energizable by a clock pulse to latch said outputs in a binary state in conformity with the binary state of said inputs during said clock pulse and wherein said means for energizing said transmission gate means includes means for generating a clock pulse of predetermined length and for applying said clock pulse to said transmission gate means if, and only if, the count of binary 1's by said counter means is first other than M and is subsequently equal to M.

12. Apparatus as set forth in claim 10, wherein said transmission gate means has latchable outputs and said transmission gate means is energizable by a clock pulse to latch said outputs in a binary state in conformity with the binary state of said inputs during said clock pulse and wherein said means for energizing said transmission gate means includes means for generating a clock pulse of predetermined length and for applying said clock pulse to said transmission gate means if, and only if, the count of binary 1's by said counter means is first equal to N and is subsequently equal to M.

13. Apparatus as set forth in claim 12, and wherein said means for energizing said transmission gate means includes flip-flop means settable in response to, and only to, a count of binary 1's by said count means equal to N and means responsive to a setting of said flip-flop and also to a count of binary 1's by said counter means equal to, and only to, M for generating and applying a clock pulse to said transmission gate means.

14. Apparatus as set forth in claim 13 and further including:

means responsive to the generation of said clock pulse for resetting said flip-flop means.

15. The method of sending binary coded words to a remotely located data-handling means comprising:

sending serially a plurality of different words each having the same number N of binary bits and each different word having the same number M of binary 1's and the same number (N−M) of binary 0's as any other word but in a different arrangement, sending a binary coded signal in between the sending of consecutive of said words, said signal having N number of binary bits and a number of binary 1's therein which is other than the number M, receiving said words and said signals at the remote location of said data-handling means, allowing selected bits of any of said received words to be applied to said data-handling means if said received word has a count of binary 1's therein equal to the number M and if such count is preceded by a count of binary 1's not equal to the number M, inhibiting said selected bits of a received word from being applied to said data-handling means if such received word has a count of binary 1's therein which is not equal to the number M.

16. The method as set forth in claim 15 wherein the steps of sending binary coded signals in between the sending or words includes sending such signals each with N number of binary 1's therein, and wherein the steps of allowing selected bits of received words to be applied to said data-handling means includes that the count of binary 1's not equal to the number M be equal to the number N.

17. The method as set forth in claim 15 and further including:

maintaining the application of the selected bits of an allowed received word to said data-handling means until a subsequent word is received which has a count of binary 1's therein equal to the number M.

18. Apparatus for transmitting words composed of binary bits, comprising:

a sending station, a receiving station, word-selection means at said sending station for sequentially selecting one of up to [N!/M!(N−M)!] different words to be sent, wherein M is an integer and N>M>O, coding and transmission means associated with said word-selection means for normally causing binary coded words to be received at said receiving station with a uniquely different binary code for each different word selected by said word-selection means but each having M number of binary 1's and N−M number of binary 0's, and for normally causing a binary coded word to be received at said receiving station during the time between each change of word selected by said word-selection means and with such word having other than M number of binary 1's.

counter means at said receiving station for counting the number of binary 1's in each binary coded word received at said receiving station, means at said receiving station and responsive to the count of said counter means for enabling a binary coded word to be used at said receiving station if, and only if, the count of binary 1's in said word by said counter means is equal to M and such count of said counter means has been preceded by a count of binary 1's which is not equal to M.

19. Apparatus as set forth in claim 18 wherein the binary coded word of said coding and transmission means, which is normally received at said receiving station during the time between each change of word selected by said word-selection means and has other than M number of binary 1's, is a word in which all bits thereof are of the same binary state, and wherein said means responsive to the count of said counter means is only operable to enable a binary coded word to be used at said receiving station if the count of binary 1's in said word by said counter means has been preceded by a count of binary 1's indicating the reception of said binary coded word in which all bits thereof are of the same binary state.

20. Apparatus as set forth in claim 18 wherein the binary coded word of said coding and transmission means, which is normally received at said receiving station during the time between each change of word selected by said word-selection means and has other than M number of binary 1's, is a word in which all bits thereof are binary 1's, and wherein said means responsive to the count of said counter means is only operable to enable a binary coded word to be used at said receiving station if the count of binary 1's in said word by said counter means has been preceded by a count of binary 1's indicating the reception of a binary coded word in which all bits thereof are binary 1's.

21. Apparatus as set forth in claim 18 wherein the binary coded word of said coding and transmission means, which is normally received at said receiving station during the time between each change of word selected by said word-selection means, has N number of binary 1's and wherein said means responsive to the count of said counter means is only operable to enable a binary coded word to be used at said receiving station if the count of binary 1's in said word by said counter means has been preceded by a count of N number of binary 1's.

22. Apparatus for transmitting words composed of binary bits, comprising:

a sending station, a receiving station, word-selection means at said sending station for sequentially selecting one of up to [N!/M!(N−M)!] different words to be sent, wherein M is an integer and N>M>O, coding and transmission means associated with said word-selection means for normally causing binary coded words to be received at said receiving station with a uniquely different binary code for each word selected by said word-selection means but each having M number of binary 1's and N−M number of binary 0's, counter means at said receiving station for counting the number of binary 1's in each binary coded word received at said receiving station, a transmission gate means at said receiving station and having a plurality of inputs each of which is continuously connected for reception of a selected bit of said words received by said receiving station, said transmission gate means having a latchable output associated with each of said inputs, said transmission gate means being energizable by a clock pulse to latch said outputs in a binary state in conformity with the binary state of said inputs during said clock pulse, means for generating a gate pulse in response to a count of binary 1's by said counter means if, and only if, the count is equal to the number M, and for applying said clock pulse to said transmission gate means.

23. Apparatus as set forth in claim 22, wherein said coding and transmission means includes means for normally causing a binary coded word to be received at said receiving station during the time between each change of word selected by said word-selection means, such word having other than M number of binary 1's, and wherein said means for generating a gate pulse and for applying said gate pulse to said transmission means is operable if, and only if, the count of said counter means is first other than M and is subsequently equal to M.

24. Apparatus as set forth in claim 23, wherein said means for generating said clock pulse includes means for limiting the length of said pulse to a predetermined value, and further including delay means for delaying the generation of said clock pulse until a predetermined time after the count of said counter means equals the number M.

25. Apparatus as set forth in claim 22, wherein said coding and transmission means includes means for normally causing a binary coded word to be received at said receiving station during the time between each change of word selected by said word-selection means, such word having N number of binary 1's, and wherein said means for generating a gate pulse and for applying said gate pulse to said transmission gate means is operable if, and only if, the count of binary 1's by said counter means is first equal to the number N and is subsequently equal to the number M.

26. Apparatus as set forth in claim 22, wherein said coding and transmission means include means for normally causing a binary coded word to be received at said receiving station during the time between each change of word selected by said word-selection means, such word having N number of binary 1's, and wherein said means for generating a gate pulse and for applying said gate pulse to said transmission gate means includes flip-flop means settable in response to a count of binary 1's by said counter means equal to N and means responsive to a setting of said flip-flop means and also to a count of binary 1's by said counter means equal to M for generating said clock pulse.

27. Apparatus as set forth in claim 26 and further including:

means responsive to the generation of said clock pulse for resetting said flip-flop means.

* * * * *